US007646241B2

(12) United States Patent
Lee et al.

(10) Patent No.: US 7,646,241 B2
(45) Date of Patent: Jan. 12, 2010

(54) LOW-VOLTAGE OPERATIONAL AMPLIFIER AND OPERATIONAL AMPLIFYING METHOD

(75) Inventors: Kang-Jin Lee, Seoul (KR); Eun-Seok Shin, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 61 days.

(21) Appl. No.: 11/862,772

(22) Filed: Sep. 27, 2007

(65) Prior Publication Data

US 2008/0106334 A1    May 8, 2008

(30) Foreign Application Priority Data

Nov. 2, 2006    (KR) .................. 10-2006-0107526

(51) Int. Cl.
*H03F 3/45* (2006.01)

(52) U.S. Cl. ......................... 330/253; 330/69
(58) Field of Classification Search ................ 330/253, 330/257, 261, 258, 69
See application file for complete search history.

(56) References Cited

U.S. PATENT DOCUMENTS

| 6,549,074 B2 * | 4/2003 | Ugajin et al. ............... 330/258 |
| 7,068,103 B2 * | 6/2006 | Lind .......................... 330/251 |
| 7,439,804 B2 * | 10/2008 | Taylor et al. ................. 330/259 |
| 7,453,319 B2 * | 11/2008 | Gupta et al. ................. 330/258 |

FOREIGN PATENT DOCUMENTS

| JP | 2004-297718 | 10/2004 |
| KR | 1020000027915 A | 5/2000 |
| KR | 1020000026913 A | 6/2000 |

* cited by examiner

*Primary Examiner*—Henry K Choe
(74) *Attorney, Agent, or Firm*—F. Chau & Associates, LLC (57) ABSTRACT

A low-voltage operational amplifier includes a differential amplifying stage, an output amplifying stage and a compensation stage. The differential amplifying stage amplifies a difference between a first signal and a second signal that constitute a differential pair using an input pair of NMOS transistors, and outputs an amplified first signal and an amplified second signal. The output amplifying stage amplifies a difference between the amplified first signal and the amplified second signal using an input pair of PMOS transistors, and outputs a first output signal and a second output signal that constitute a differential pair. The compensation stage receives the amplified first signal, the amplified second signal, the first output signal, and the second output signal, and reduces a settling time of the first output signal and the second output signal.

18 Claims, 6 Drawing Sheets

FIG.6 ing stage that amplifies a difference between a first signal and
LOW-VOLTAGE OPERATIONAL AMPLIFIER AND OPERATIONAL AMPLIFYING METHOD

CROSS-REFERENCE TO RELATED APPLICATION

This application claims priority under 35 USC § 119 to Korean Patent Application No. 2006-0107526, filed on Nov. 2, 2006 in the Korean Intellectual Property Office, the disclosure of which is incorporated herein in its entirety by reference.

BACKGROUND OF THE INVENTION

1. Technical Field

The present disclosure relates to an operational amplifier and, more particularly, to a low-voltage operational amplifier and an operational amplifying method.

2. Discussion of Related Art

As techniques in a semiconductor manufacturing process are improved, the width between the semiconductor circuit lines is gradually decreased. Because the width between the semiconductor circuit lines becomes narrower, an integration degree of the semiconductor is improved and a production cost of the semiconductor is reduced. In addition, as the width between the semiconductor circuit lines gradually becomes narrower, a power-supply voltage that is applied to the semiconductor gradually becomes lower. For example, a semiconductor that has a 90 nm width between the semiconductor circuit lines generally needs a power-supply voltage that is not more than 1.2V. On the other hand, a semiconductor that has a 90 nm width between the semiconductor circuit lines occasionally needs a power-supply voltage that is not more than 1.0V. Therefore, a circuit that operates properly at a high power-supply voltage may not operate properly at a low power-supply voltage. Accordingly, a circuit that has a new structure is needed.

Figure 1:
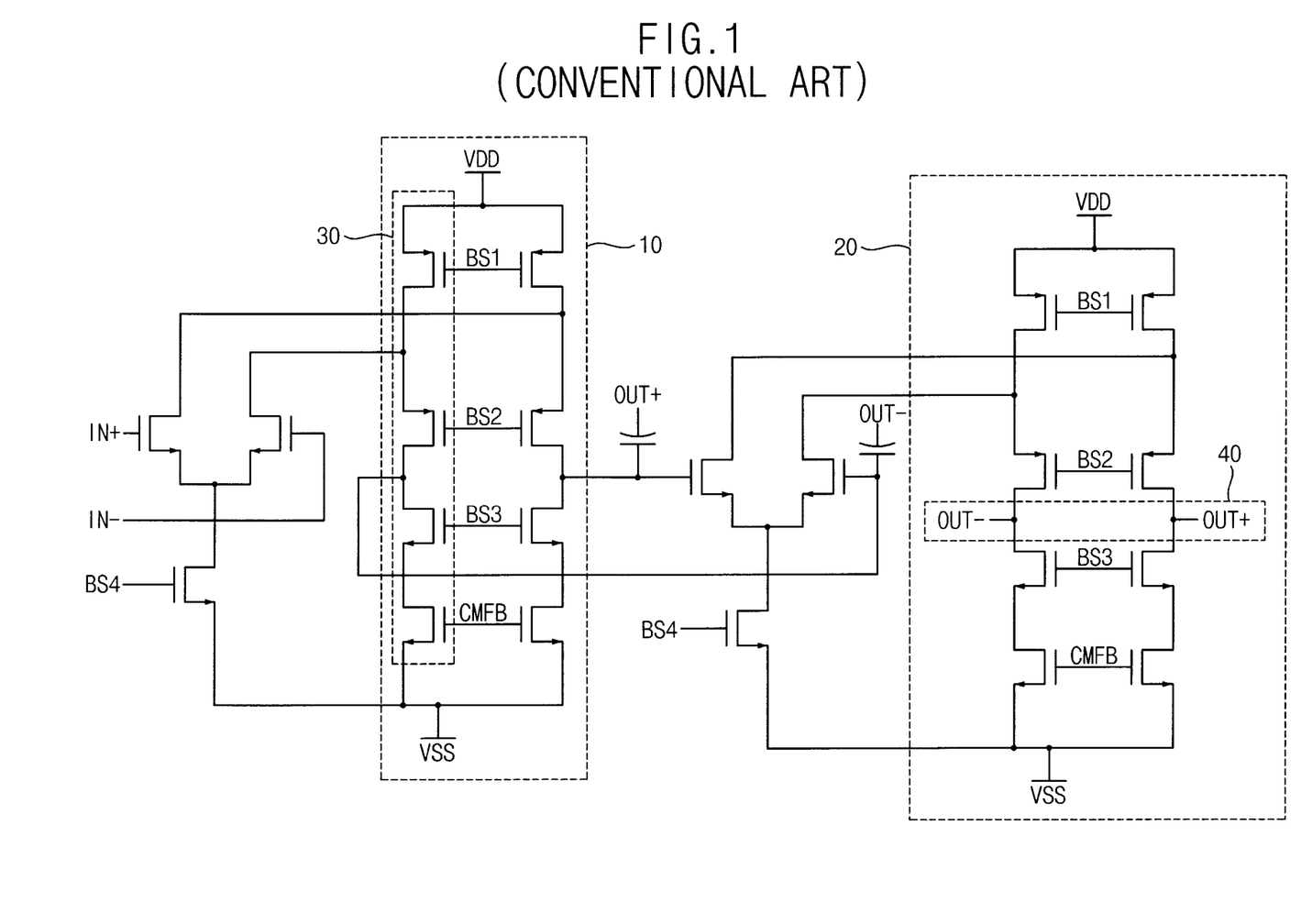
FIG. 1 is a diagram illustrating a conventional operational amplifier that has a folded cascode structure.

FIG. 1 is a diagram illustrating a conventional operational amplifier that has a folded cascode structure.

The conventional operational amplifier usually includes a multi-stage structure in order to achieve a high gain. The conventional operation amplifier shown in FIG. 1 includes two stages 10 and 20 that each have a folded cascode structure.

The conventional operational amplifier of FIG. 1 achieves the high gain owing to the cascade connected stage. There are two cascade connected stages in each stage 10 and 20, and one such cascade stage 30 has four MOS transistors connected in series between a power-supply voltage VDD and a ground voltage VSS. A second cascade connected stage of four MOS transistors is in the first stage 10 and bias voltages BS1, BS2, and BS3 are fed to respective gates of corresponding transistors and a common mode feedback signal is connected to the gates of corresponding transistors whose drains are connected to the ground voltage VSS. The input signals IN+ and IN− are fed to an input pair of transistors that have their drains connected to a current source transistor that receives at its gate a bias voltage BS4. Outputs of the first stage 10 are fed to a pair of input transistors whose drains are commonly connected to a current source transistor whose gate receives the bias voltage BS4 and whose drain is connected to the ground voltage VSS. The second stage 20 employs the same structure as the first stage 10 with corresponding transistors receiving the bias voltages BS1, BS2, and BS3 and the common mode feedback signal CMFB. Outputs 40 the second stage 20 are at the same location as the outputs of the first stage 10, with the outputs OUT+ and OUT− of the first stage being coupled with respective capacitors. As is known, a common mode feedback signal decides a common mode voltage of an amplified first signal and an amplified second signal. Thus, the conventional operational amplifier of FIG. 1 does not efficiently obtain a large dynamic voltage margin at a relatively low power-supply voltage. In addition, a swing margin at the output terminal 40 of the second cascade stage 20 is limited at a low power-supply voltage.

Figure 2:
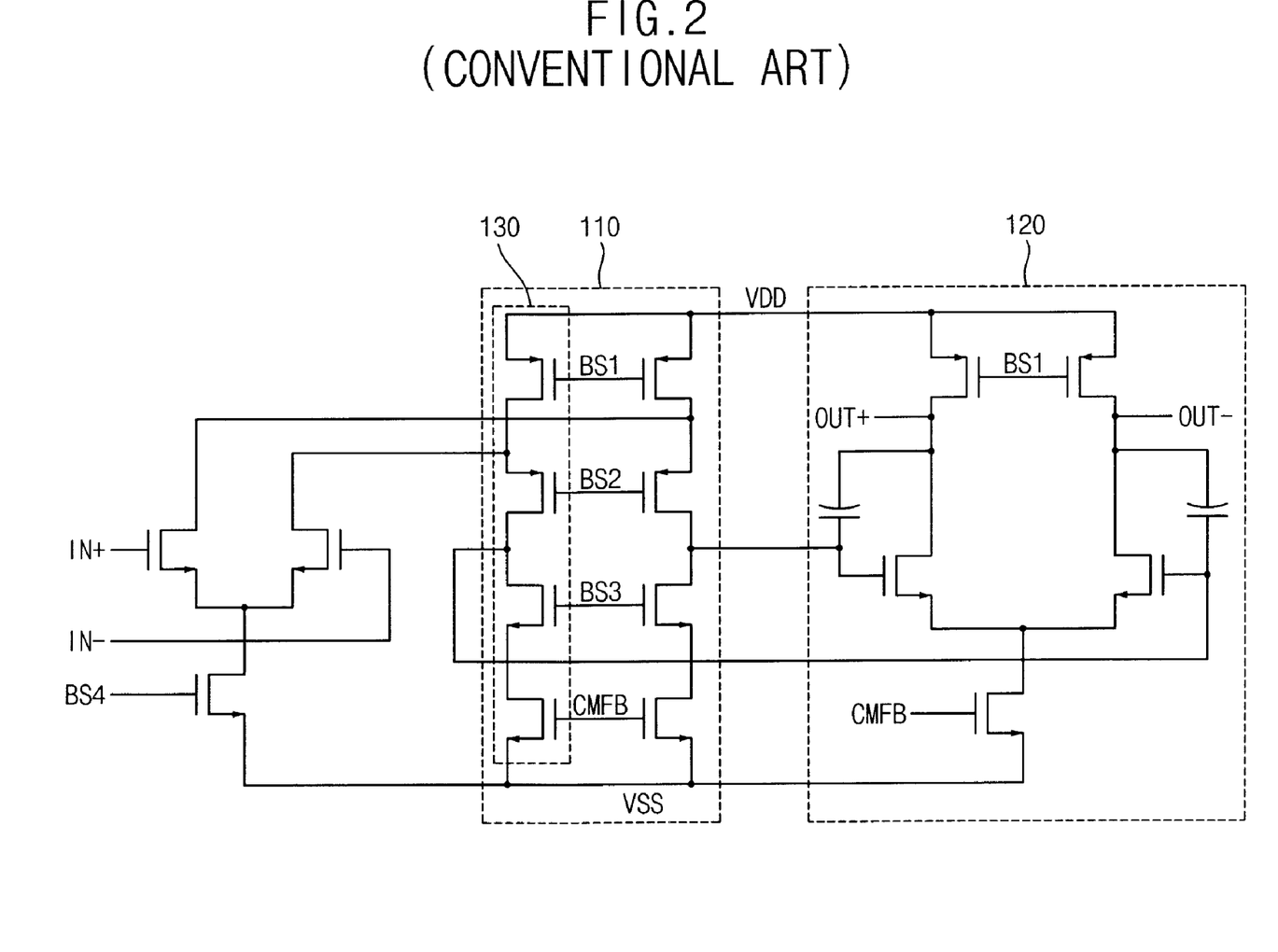
FIG. 2 is a diagram illustrating another conventional operational amplifier.

FIG. 2 is a diagram illustrating another conventional operational amplifier.

The conventional operational amplifier of FIG. 2 has a structure where a folded cascode stage 110 is connected to a common source stage 120. Therefore, the conventional operational amplifier of FIG. 2 can obtain a larger swing margin at an output terminal than the conventional operational amplifier of FIG. 1. In a folded cascode stage 110, four MOS transistors 130 are connected in series between a power-supply voltage VDD and a ground voltage VSS, as in FIG. 1. A second set of four MOS transistors are provided in the first stage 110 and respective gates of corresponding transistors receive bias voltages BS1, BS2, and BS3, as well as the common mode feedback signal CMFB. The input signals IN+ and IN− are fed to a transistor pair whose common drains are connected to a current source transistor that receives at a gate thereof a bias voltage BS4 and that has a drain connected to the ground voltage VSS. The common source stage 120 has a pair of input MOS transistors having respective gates receiving the output signals from the folded cascode stage 130. A transistor pair has its drains connected to the power-supply voltage VDD, sources connected to the input transistor pair, and gates receiving the bias voltage BS1. A current source transistor is connected between the common drains of the input transistor pair and the ground voltage VSS with the common mode feedback signal CMFB connected to the gate thereof, the outputs OUT+ and OUT− of the operational amplifier are taken from the common source stage 120 by being capacitor coupled from the outputs of the folded cascode stage 110. Thus, the conventional operational amplifier of FIG. 2 does not efficiently obtain a large dynamic voltage margin at a low power-supply voltage. In addition, the conventional operational amplifier of FIG. 2 achieves a relatively low gain compared with the other conventional operational amplifier of FIG. 1.

Accordingly, a low-voltage operational amplifier that can operate properly at a low power-supply voltage and that can have a high gain is needed.

SUMMARY OF THE INVENTION

Accordingly, exemplary embodiments of the present invention are provided to substantially obviate one or more problems due to limitations and disadvantages of the conventional art.

Exemplary embodiments of the present invention provide a low-voltage operational amplifier that operates at a low voltage and that has a high gain.

Exemplary embodiments of the present invention provide an operational amplifying method capable of reducing a settling time of output signals at a low voltage.

In exemplary embodiments of the present invention, a low-voltage operational amplifier includes a differential amplifying stage that amplifies a difference between a first signal and a second signal that constitute a differential pair using an input pair of NMOS transistors, and that outputs an amplified first signal and an amplified second signal, an output amplifying stage that amplifies a difference between the amplified first signal and the amplified second signal using an input pair of PMOS transistors, and that outputs a first output signal and a second output signal that constitute a differential pair and a compensation stage that receives the amplified first signal, the amplified second signal, the first output signal, and the second output signal and that reduces a settling time of the first output signal and the second output signal.

A power-supply voltage that is supplied to the differential amplifying stage, the output amplifying stage and the compensation stage may be between 0.9V and 1.0V.

The differential amplifying stage may have a folded cascode structure.

The differential amplifying stage may include a first transistor having a gate that receives the first signal, a second transistor having a gate that receives the second signal, and a source that is connected to a source of the first transistor, a current source connected to the source of the first transistor, a third transistor having a gate that receives a first bias signal, a drain that is connected to a drain of the second transistor and a source that is connected to a power-supply voltage, a fourth transistor having a gate that receives the first bias signal, a drain that is connected to a drain of the first transistor, and a source that is connected to the power-supply voltage, a fifth transistor having a gate that receives a second bias signal, and a source that is connected to a drain of the third transistor a sixth transistor having a gate that receives the second bias signal, and a source that is connected to a drain of the fourth transistor, a seventh transistor having a gate that receives a first common mode feedback signal, a drain that is connected to a drain of the fifth transistors and a source that is connected to a ground voltage, and a eighth transistor having a gate that receives the first common mode feedback signal a drain that is connected to a drain of the sixth transistor, and a source that is connected to the ground voltage.

The amplified second signal may be outputted from the drain of the fifth transistor and the drain of the seventh transistor, and the amplified first signal may be outputted from the drain of the sixth transistor and the drain of the eighth transistor.

Each of the seventh transistor and the eighth transistor may be a long-channel NMOS transistor.

The current source may be a NMOS transistor having a gate that receives a fourth bias signal, and a source that is connected to the ground voltage.

The output amplifying stage may have a folded cascode structure.

The output amplifying stage may include a first transistor having a gate that receives the amplified second signal, a second transistor having a gate that receives the amplified first signal, and a drain that is connected to a drain of the first transistor a current source connected to the drain of the first transistor, a third transistor having a gate that receives a third bias signal, and a source that is connected to a drain of the second transistor, a fourth transistor having a gate that receives the third bias signal, and a source that is connected to a drain of the first transistor, a fifth transistor having a gate that receives a fourth bias signal, a drain that is connected to a source of the third transistor, and a source that is connected to a ground voltage, a sixth transistor having a gate that receives the fourth bias signal, a drain that is connected to a source of the fourth transistor, and a source that is connected to the ground voltage, a seventh transistor having a gate that receives a second common mode feedback signal, a drain that is connected to a drain of the third transistor, and a source that is connected to a power-supply voltage, and a eighth transistor having a gate that receives the second common mode feedback signal, a drain that is connected to a drain of the fourth transistor, and a source that is connected to the power-supply voltage.

The first output signal may be outputted from the drain of the third transistor and the drain of the seventh transistor, and the second output signal may be outputted from the drain of the fourth transistor and the drain of the eighth transistor.

The current source may be a long-channel PMOS transistor having a gate that receives a first bias signal, and a source that is connected to the power-supply voltage.

The compensation stage may have a folded cascode structure.

The compensation stage may include a first transistor having a gate that receives a first bias signal, and a source that is connected to a power-supply voltage, a second transistor having a gate that receives the first bias signal, and a source that is connected to the power-supply voltage, a third transistor having a gate that receives a second bias signal, and a source that is connected to a drain of the first transistor a fourth transistor having a gate that receives the second bias signal, and a source that is connected to a drain of the second transistor, a fifth transistor having a gate that receives a first common mode feedback signal, a drain that is connected to a drain of the third transistor, and a source that is connected to a ground voltage, a sixth transistor having a gate that receives the first common mode feedback signal, a drain that is connected to a drain of the fourth transistor, and a source that is connected to the ground voltage, a first compensation capacitor having a terminal that is connected to the drain of the first transistor, and another terminal that receives the second output signal, and a second compensation capacitor having a terminal that is connected to the drain of the second transistor, and another terminal that receives the first output signal.

The amplified first signal may be applied to the drain of the fourth transistor and the drain of the sixth transistor, and the amplified second signal may be applied to the drain of the third transistor and the drain of the fifth transistor.

In exemplary embodiments of the present invention, a low-voltage operational amplifier includes a differential amplifying stage that amplifies a difference between a first signal and a second signal that constitute a differential pair using an input pair of PMOS transistors, and that outputs an amplified first signal and an amplified second signal, an output amplifying stage that amplifies a difference between the amplified first signal and the amplified second signal using an input pair of NMOS transistors, and that outputs a first output signal and a second output signal that constitute a differential pair, and a compensation stage that receives the amplified first signal, the amplified second signal, the first output signal, and the second output signal, and that reduces a settling time of the first output signal and the second output signal.

A power-supply voltage that is supplied to the differential amplifying stage, the output amplifying stage, and the compensation stage may be between 0.9V and 1.0V.

The differential amplifying stage may have a folded cascode structure.

The differential amplifying stage may include a first transistor having a gate that receives the first signal, a second transistor having a gate that receives the second signal, and a source that is connected to a source of the first transistor, a current source connected to the source of the first transistor, a third transistor having a gate that receives a third bias signal, and a source that is connected to a drain of the second transistor, a fourth transistor having a gate that receives the third bias signal, and a source that is connected to a drain of the first transistor a fifth transistor having a gate that receives a fourth bias signal, a drain that is connected to a source of the third transistor, and a source that is connected to a ground voltage, a sixth transistor having a gate that receives the fourth bias signal, a drain that is connected to a source of the fourth transistor, and a source that is connected to the ground voltage, a seventh transistor having a gate that receives a second common mode feedback signal, a drain that is connected to a drain of the third transistor, and a source that is connected to a power-supply voltage, and a eighth transistor having a gate that receives the second common mode feedback signal, a drain that is connected to a drain of the fourth transistor; and a source that is connected to the power-supply voltage.

The amplified second signal may be outputted from the source of the third transistor and the source of the seventh transistor, and the amplified first signal may be outputted from the drain of the fourth transistor and the drain of the eighth transistor.

The current source may be a tong-channel PMOS transistor having a gate that receives a first bias signal, a source that is connected to the power-supply voltage.

The output amplifying stage may have a folded cascode structure.

The output amplifying stage may include a first transistor having a gate that receives the amplified second signal, a second transistor having a gate that receives the amplified first signal, and a source that is connected to a source of the first transistor, a current source connected to the source of the first transistor, a third transistor having a gate that receives a first bias signal, a drain that is connected to a drain of the second transistor, and a source that is connected to a power-supply voltage, a fourth transistor having a gate that receives the first bias signal, a drain that is connected to a drain of the first transistor, and a source that is connected to the power-supply voltage, a fifth transistor having a gate that receives a second bias signal, and a source that is connected to a drain of the third transistor, a sixth transistor having a gate that receives the second bias signal, and a source that is connected to a drain of the fourth transistor, a seventh transistor having a gate that receives a first common mode feedback signal, a drain that is connected to a drain of the fifth transistor, and a source that is connected to a ground voltage, and a eighth transistor having a gate that receives the first common mode feedback signal, a drain that is connected to a drain of the sixth transistor, and a source that is connected to the ground voltage.

The first output signal may be outputted from the drain of the fifth transistor and the drain of the seventh transistor, and the second output signal may be outputted from the drain of the sixth transistor and the drain of the eighth transistor.

Each of the seventh transistor and the eighth transistor may be a long-channel NMOS transistor.

The current source may be a PMOS transistor having a gate that receives a fourth bias signal, and a source that is connected to the ground voltage.

The compensation stage may have a folded cascode structure.

The compensation stage may include a first transistor having a gate that receives a third bias signal, a second transistor having a gate that receives the third bias signal, a third transistor having a gate that receives a fourth bias signal, a drain that is connected to a source of the first transistor, and a source that is connected to a ground voltage a fourth transistor having a gate that receives the fourth bias signal, a drain that is connected to a source of the second transistor, and a source that is connected to the ground voltage, a fifth transistor having a gate that receives a second common mode feedback signal, a drain that is connected to a drain of the first transistor, and a source that is connected to a power-supply voltage, a sixth transistor having a gate that receives the second common mode feedback signal, a drain that is connected to a drain of the second transistor, and a source that is connected to the power-supply voltage, a first compensation capacitor having a terminal that is connected to the source of the first transistor, and another terminal that receives the second output signal, and a second compensation capacitor having a terminal that is connected to the source of the second transistor, and another terminal that receives the first output signal.

The amplified first signal may be applied to the drain of the second transistor and the drain of the sixth transistor, and the amplified second signal may be applied to the drain of the first transistor and the drain of the fifth transistor.

In exemplary embodiments of the present invention, an operational amplifying method includes amplifying a difference between a first signal and a second signal that constitute a differential pair, outputting an amplified first signal and an amplified second signal, amplifying a difference between the amplified first signal and the amplified second signal, outputting a first output signal and a second output signal that constitute a differential pair, receiving the amplified first signal, the amplified second signal, the first output signal, and the second output signal, and reducing a settling time of the first output signal and the second output signal.

Accordingly, the low-voltage operational amplifier can have a high gain, a large swing margin, and a fast settling time, and can operate at a low voltage. The operational amplifying method can reduce a settling time of output signals.

BRIEF DESCRIPTION OF THE DRAWINGS

Exemplary embodiments of the present invention will be understood in more detail from the following descriptions taken in conjunction with the attached drawings.

DESCRIPTION OF EXEMPLARY
EMBODIMENTS

Exemplary embodiments of the present invention now will be described more fully with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those of ordinary skill in the art. Like reference numerals refer to like elements throughout this application.

Figure 3:
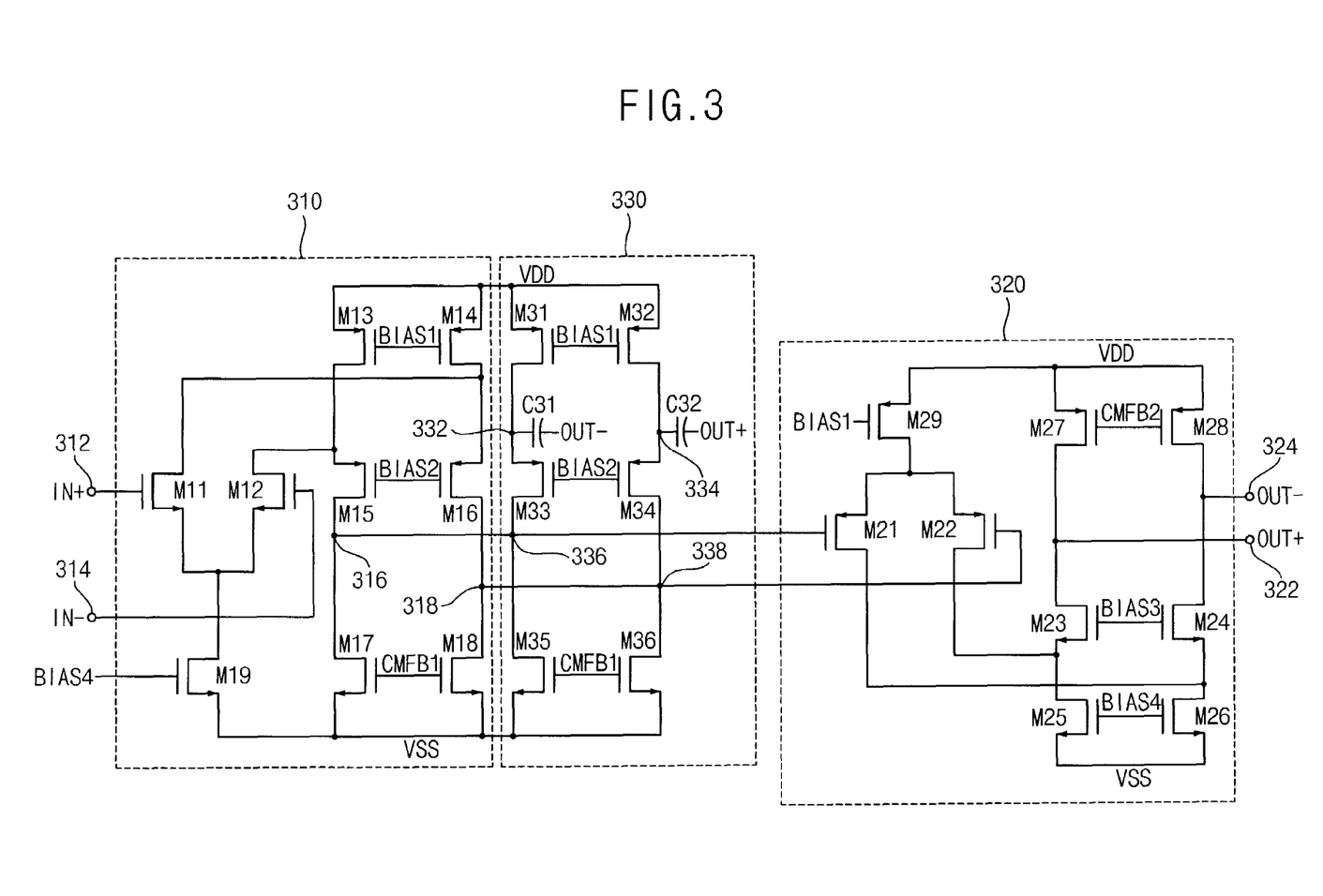
FIG. 3 is a circuit diagram illustrating a low-voltage operational amplifier according to an exemplary embodiment of the present invention.

FIG. 3 is a circuit diagram illustrating a low-voltage operational amplifier according to an exemplary embodiment of the present invention.

Referring to FIG. 3, the low-voltage operational amplifier includes a differential amplifying stage 310 that includes an input pair of NMOS transistors a differential amplifying stage 320 that includes an input pair of PMOS transistors, and a compensation stage 330.

The differential amplifying stage 310 is implemented with a differential amplifier that has a relatively high gain. The differential amplifier has a strong characteristic against environmental noise compared to a single-ended amplifier. The differential amplifying stage 310 has two input terminals 312 and 314 receiving respective inputs IN+ and IN−. The differential amplifying stage 310 receives a first signal IN+ and a second signal IN− through the input terminals 312 and 314, and amplifies the first signal and the second signal that constitute a differential pair. The amplified first signal and the amplified second signal are outputted through two nodes 318 and 316, respectively.

The differential amplifying stage 310 has a folded cascode structure. A first transistor M11 and a second transistor M12 constitute a common source circuit. A source of the first transistor M11 and a source of the second transistor M12 are connected to a drain of a NMOS transistor M19 that operates as a current source. A gate of the first transistor M11 receives the first signal IN+, and a gate of the second transistor M12 receives the second signal IN− that forms a differential pair together with the first signal.

A gate of a third transistor M13 and a gate of a fourth transistor M14 receive a first bias signal BIAS1. A source of the third transistor M13 and a source of the fourth transistor M14 are connected to a power-supply voltage VDD. The third transistor M13 provides a current that flows through the second transistor M12 and a current that flows through a fifth transistor M15. The fourth transistor M14 provides a current that flows through the first transistor M11 and a current that flows through a sixth transistor M16.

A gate of the fifth transistor M15 and a gate of the sixth transistor M16 receive a second bias signal BIAS2. A source of the fifth transistor M15 is connected to a drain of the third transistor M13 and a drain of the second transistor M12. A source of the sixth transistor M16 is connected to a drain of the fourth transistor M14 and a drain of the first transistor M11. The amplified second signal is outputted from the drain at node 316 of the fifth transistor M15, and the amplified first signal is outputted from the drain at node 318 of the sixth transistor M16.

A gate of a seventh transistor M17 and a gate of an eighth transistor M18 receive a common mode feedback signal CMFB1. A drain of the seventh transistor M17 is connected to the drain of the fifth transistor M15, and a source of the seventh transistor M17 is connected to a ground voltage VSS. A drain of the eighth transistor M18 is connected to the drain of the sixth transistor M16, and a source of the eighth transistor M18 is connected to the ground voltage VSS. Each of the seventh transistor M17 and the eighth transistor M18 is implemented with a relatively long-channel transistor in order to compensate for any loss of gain. The common mode feedback signal CMFB1 decides a common mode voltage of the amplified first signal and the amplified second signal in the known manner.

A gate of the NMOS transistor M19 that operates as the current source receives a fourth bias signal BIAS4. A source of the NMOS transistor M19 is connected to the ground voltage VSS.

That is, the differential amplifying stage 310 amplifies a difference between the first signal and the second signal, and provides the amplified second signal and the amplified first signal through the drain of the fifth transistor M15 at node 316 and the drain of the sixth transistor M16 at node 318, respectively.

Since the differential amplifying stage 310 of FIG. 3 includes fewer transistors connected between the power-supply voltage VDD and the ground voltage VSS than the conventional differential amplifying stage shown in FIG. 1 and the conventional differential amplifying stage shown in FIG. 2, the low-voltage operational amplifier of FIG. 3 has advantages related to a voltage consumption compared with the conventional operational amplifier shown in FIG. 1 and the conventional operational amplifier shown in FIG. 2. In addition, the low-voltage operational amplifier of FIG. 3 achieves a larger dynamic voltage margin than the conventional operational amplifier shown in FIG. 1 and the conventional operational amplifier shown in FIG. 2. The differential amplifying stage 310 ensures the relatively high gain of the operational amplifier.

The output amplifying stage 320 receives the amplified first signal and the amplified second signal that are amplified by the differential amplifying stage 310, and further amplifies the received signals to output a first output signal OUT+ and a second output signal OUT− through output nodes 322 and 324. The first output signal and the second output signal form a differential pair.

The output amplifying stage 320 has a folded cascode structure. A first transistor M21 and a second transistor M22 constitute a common source circuit. A source of the first transistor M21 and a source of the second transistor M22 are connected to a drain of a PMOS transistor M29 that operates as a current source. A gate of the PMOS transistor M29 receives the first bias signal BIAS1, and a source of the PMOS transistor M29 is connected to the power-supply voltage VDD. A gate of the first transistor M21 receives the amplified second signal from node 316, and a gate of the second transistor M22 receives the amplified first signal from node 318.

A gate of a third transistor M23 and a gate of a fourth transistor M24 receive a third bias signal BIAS3. A source of the third transistor M23 is connected to a drain of the second transistor M22, and a source of the fourth transistor M24 is connected to a drain of the first transistor M21.

A gate of a fifth transistor M25 and a gate of a sixth transistor M26 receive a fourth bias signal BIAS4. A drain of the fifth transistor M25 is connected to the source of the third transistor M23, and a source of the fifth transistor M25 is connected to the ground voltage VSS. A drain of the sixth transistor M26 is connected to the source of the fourth transistor M24, and a source of the sixth transistor M26 is connected to the ground voltage VSS.

A gate of a seventh transistor M27 and a gate of an eighth transistor M28 receive a common mode feedback signal CMFB2. A drain of the seventh transistor M27 is connected to the drain of the third transistor M23, and a source of the seventh transistor M27 is connected to the power-supply voltage VDD. A drain of the eighth transistor M28 is connected to the drain of the fourth transistor M24 and a source of the eighth transistor M28 is connected to the power-supply voltage VDD. Each of the seventh transistor M27 and the eighth transistor M28 is implemented with a long-channel transistor in order to compensate for any loss of gain. The output amplifying stage 320 ensures a large swing margin of the first output signal OUT+ and the second output signal OUT−.

The compensation stage 330 receives the amplified first signal, the amplified second signal, the first output signal, and the second output signal and reduces a settling time of the first output signal and the second output signal.

The compensation stage 330 has a folded cascade structure. A gate of a first transistor M31 and a gate of a second transistor M32 receive the first bias signal BIAS1. A source of the first transistor M31 and a source of the second transistor M32 are connected to the power-supply voltage VDD.

A gate of a third transistor M33 and a gate of a fourth transistor M34 receive the second bias signal BIAS2. A source of the third transistor M33 is connected to a drain of the first transistor M31, and a source of the fourth transistor M34 is connected to a drain of the second transistor M32. A node 332 where the drain of the first transistor M31 and the source of the third transistor M33 are connected is connected to a first compensation capacitor C31. The first compensation capacitor C31 receives the second output signal OUT− as feedback. A node 334 where the drain of the second transistor M32 and the source of the fourth transistor M34 are connected is connected to a second compensation capacitor C32. The second compensation capacitor C32 receives the first output signal OUT+ as feedback.

A gate of a fifth transistor M35 and a gate of a sixth transistor M36 receive the common mode feedback signal CMFB1. A drain of the fifth transistor M35 is connected to the drain of the third transistor M33, and a source of the fifth transistor M35 is connected to the ground voltage VSS. A drain of the sixth transistor M36 is connected to the drain of the fourth transistor M34, and a source of the sixth transistor M36 is connected to the ground voltage VSS.

A node 336 where the drain of the third transistor M33 and the drain of the fifth transistor M35 are connected receives the amplified second signal. A node 338 where the drain of the fourth transistor M34 and the drain of the sixth transistor M36 are connected receives the amplified first signal.

The compensation stage 330 includes the compensation capacitors C31 and C32 that are added to the amplifier having a folded cascade structure. Thus, the compensation stage 330 reduces the settling time of an output of the operational amplifier. That is, by adding the compensation stage 330 to the operational amplifier, the zeros of a transfer function of the operational amplifier can be removed, and the poles of the transfer function become spaced apart from each other. Therefore, the speed of the operational amplifier increases, and the setting time is reduced.

The operational amplifier of FIG. 3 ensures the high gain owing to the differential amplifying stage 310, ensures the large swing margin owing to the output amplifying stage 320, and reduces the settling time owing to the compensation stage 330. In addition, the operational amplifier of FIG. 3 can operate at a relatively low power-supply voltage between 0.9V and 1.0V which is supplied as VDD to the differential amplifying stage 310, the output amplifying stage 320, and the compensation stage 330.

Figure 4:
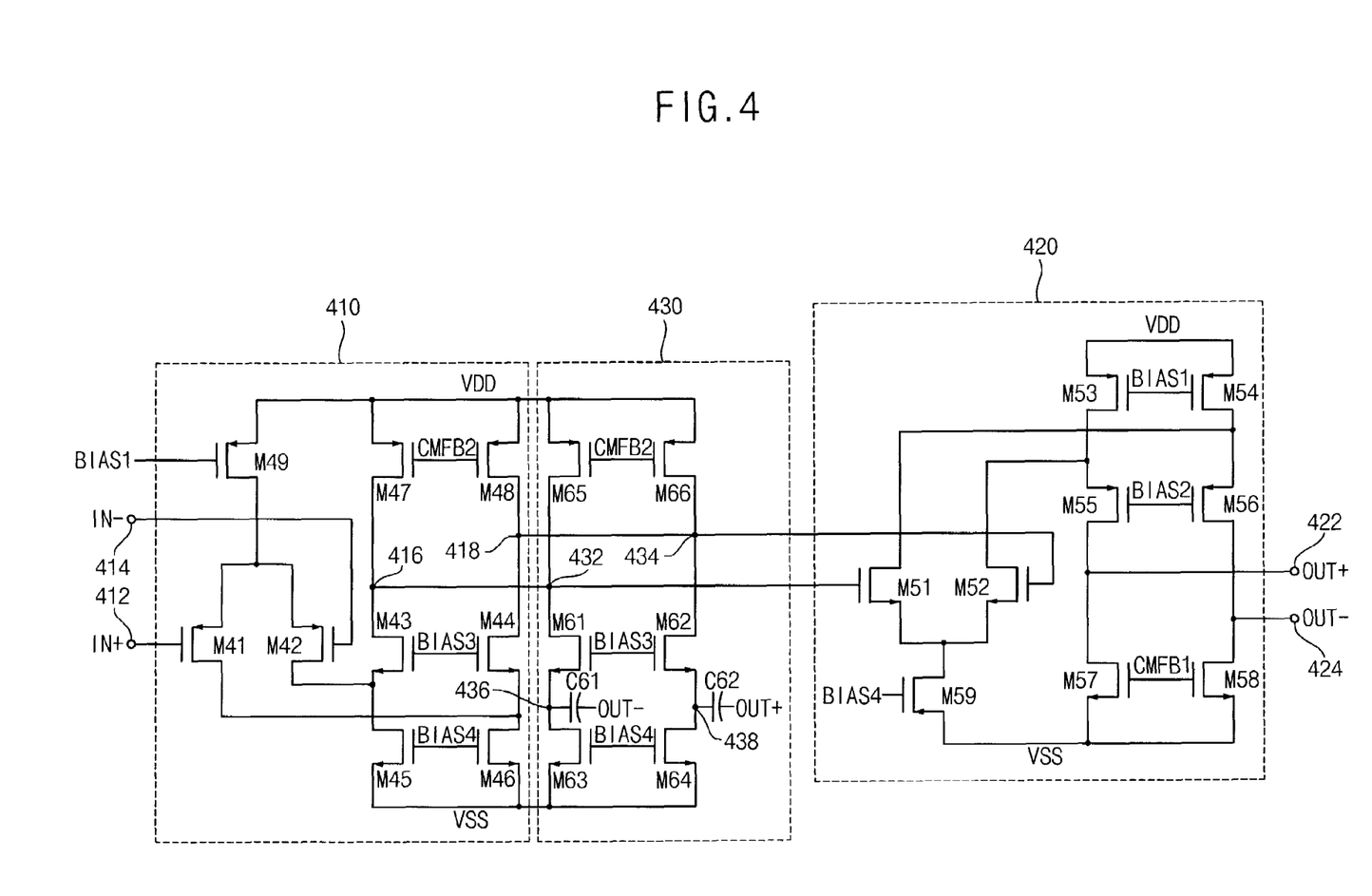
FIG. 4 is a circuit diagram illustrating a low-voltage operational amplifier according to an exemplary embodiment of the present invention.

FIG. 4 is a circuit diagram illustrating a low-voltage operational amplifier according to an exemplary embodiment of the present invention.

Referring to FIG. 4, the low-voltage operational amplifier includes a differential amplifying stage 410 that includes an input pair of PMOS transistors, an output amplifying stage 420 that includes an input pair of NMOS transistors and a compensation stage 430.

The differential amplifying stage 410 includes two input terminals 412 and 414. The differential amplifying stage 410 receives a first signal IN+ and a second signal IN− through the input terminals 412 and 414, respectively, and amplifies the first signal and the second signal that constitute a differential pair. The amplified first signal and the amplified second signal are outputted to the output amplifying stage 420 and the compensation stage 430 through two nodes 418 and 416, respectively.

The differential amplifying stage 410 has a folded cascode structure. A first transistor M41 and a second transistor M42 constitute a common source circuit. A source of the first transistor M41 and a source of the second transistor M42 are connected to a drain of a PMOS transistor M49 that operates as a current source. A gate of the PMOS transistor M49 receives a first bias signal BIAS1, and a source of the PMOS transistor M49 is connected to a power-supply voltage VDD.

A gate of a third transistor M43 and a gate of a fourth transistor M44 receive a third bias signal BIAS3. A source of the third transistor M43 is connected to the drain of the second transistor M42, and a source of the fourth transistor M44 is connected to the drain of the first transistor M41.

A gate of the fifth transistor M45 and a gate of the sixth transistor M46 receive a fourth bias signal BIAS4. A drain of the fifth transistor M45 is connected to a source of the third transistor M43, and a source of the fifth transistor M45 is connected to a ground voltage VSS. A drain of the sixth transistor M46 is connected to a source of the fourth transistor M44, and a source of the sixth transistor M46 is connected to the ground voltage VSS.

A gate of a seventh transistor M47 and a gate of an eighth transistor M48 receive a common mode feedback signal CMFB2. A drain of the seventh transistor M47 is connected to the drain of the third transistor M43, and a source of the seventh transistor M47 is connected to the power-supply voltage VDD. A drain of the eighth transistor M48 is connected to the drain of the fourth transistor M44, and a source of the eighth transistor M48 is connected to the power-supply voltage VDD. Each of the seventh transistor M47 and the eighth transistor M48 is implemented with a long-channel transistor.

The differential amplifier 410 ensures a relatively high gain of the low-voltage operational amplifier.

An output amplifying stage 420 receives the amplified first signal and the amplified second signal that are amplified by the differential amplifying stage 410, and further amplifies the received signals to output a first output signal OUT+ and a second output signal OUT− through output nodes 422 and 424, respectively. The first output signal and the second output signal form a differential pair.

The output amplifying stage 420 has a folded cascode structure. A first transistor M51 and a second transistor M52 constitute a common source circuit. A source of the first transistor M51 and a source of the second transistor M52 are connected to a drain of a PMOS transistor M59 that operates as a current source. A gate of the PMOS transistor M59 receives a fourth bias signal BIAS4 and a source of the PMOS transistor M59 is connected to the ground voltage VSS. A gate of the first transistor M51 receives an amplified second signal from node 416, and a gate of the second transistor M52 receives an amplified first signal from node 418.

A gate of a third transistor M53 and a gate of a fourth transistor M54 receive the first bias signal BIAS1. A source of the third transistor M53 and a source of the fourth transistor M54 are connected to the power-supply voltage VDD.

A gate of a fifth transistor M55 and a gate of a sixth transistor M56 receive the second bias signal BIAS2. A source of the fifth transistor M55 is connected to the drain of the third transistor M53 and the drain of the second transistor M52. A source of the sixth transistor M55 is connected to the drain of the fourth transistor M54 and the drain of the first transistor M51.

A gate of a seventh transistor M57 and a gate of an eighth transistor M58 receive a common mode feedback signal CMFB1. A drain of the seventh transistor M57 is connected to the drain of the fifth transistor M55, and a source of the seventh transistor M57 is connected to the ground voltage VSS. A drain of the eighth transistor M58 is connected to the drain of the sixth transistor M56 and a source of the eighth transistor M58 is connected to the ground voltage VSS. Each of the seventh transistor M57 and the eighth transistor M58 is implemented with a long-channel transistor. The common mode feedback signal CMFB1 decides a common mode voltage of the amplified first signal and the amplified second signal.

A gate of a PMOS transistor M59 that operates as a current source receives a fourth bias signal BIAS4, and a source of the PMOS transistor M59 is connected to the ground voltage VSS.

The output amplifying stage 420 ensures a large swing margin of the first output signal and the second output signal.

The compensation stage 430 receives the amplified first signal, the amplified second signal, the first output signal, and the second output signal, and reduces a settling time of the first output signal and the second output signal.

The compensation stage 430 has a folded cascade structure. A gate of a first transistor M61 and a gate of a second transistor M62 receive a third bias signal BIAS3.

A gate of a third transistor M63 and a gate of a fourth transistor M64 receive the fourth bias signal BIAS4. A drain of the third transistor M63 is connected to a source of the first transistor M61, and a source of the third transistor M63 is connected to the ground voltage VSS. A drain of the fourth transistor M64 is connected to a source of the second transistor M62, and a source of the fourth transistor M64 is connected to the ground voltage VSS. A node 436 where the source of the first transistor M61 and the drain of the third transistor M63 are connected is connected to a first compensation capacitor C61. The first compensation capacitor C61 receives the second output signal OUT− as feedback. A node 438 where the source of the second transistor M62 and the drain of the fourth transistor M64 are connected is connected to a second compensation capacitor C62. The second compensation capacitor C62 receives the first output signal OUT+ as feedback.

A gate of a fifth transistor M65 and a gate of a sixth transistor M66 receive a common mode feedback signal CMFB2. A drain of the fifth transistor M65 is connected to the drain of the first transistor M61, and a source of the fifth transistor M65 is connected to the power-supply voltage VDD. A drain of the sixth transistor M66 is connected to the drain of the second transistor M62, and a source of the sixth transistor M66 is connected to the power-supply voltage VDD.

A node 432 where the drain of the first transistor M61 and the drain of the fifth transistor M65 are connected receives the amplified second signal. A node 434 where the drain of the second transistor M62 and the drain of the sixth transistor M66 are connected receives the amplified first signal.

The compensation stage 430 includes the compensation capacitors C61 and C62 that are added to the amplifier of a folded cascade structure. Thus the compensation stage 430 reduces the settling time of an output of the operational amplifier. That is, by adding the compensation stage 430 to the operational amplifier, the zeros of a transfer function of the operational amplifier can be removed, and the poles of the transfer function become spaced apart from each other. Therefore, the speed of the operational amplifier increases, and the settling time is reduced.

The operational amplifier of FIG. 4 ensures the high gain owing to the differential amplifying stage 410, ensures the large swing margin owing to the output amplifying stage 420, and reduces the settling time owing to the compensation stage 430. In addition, the operational amplifier of FIG. 5 can operate at a relatively low power-supply voltage between 0.9V and 1.0V, which is supplied to the differential amplifying stage 410, the output amplifying stage 420, and the compensation stage 430.

Figure 5:
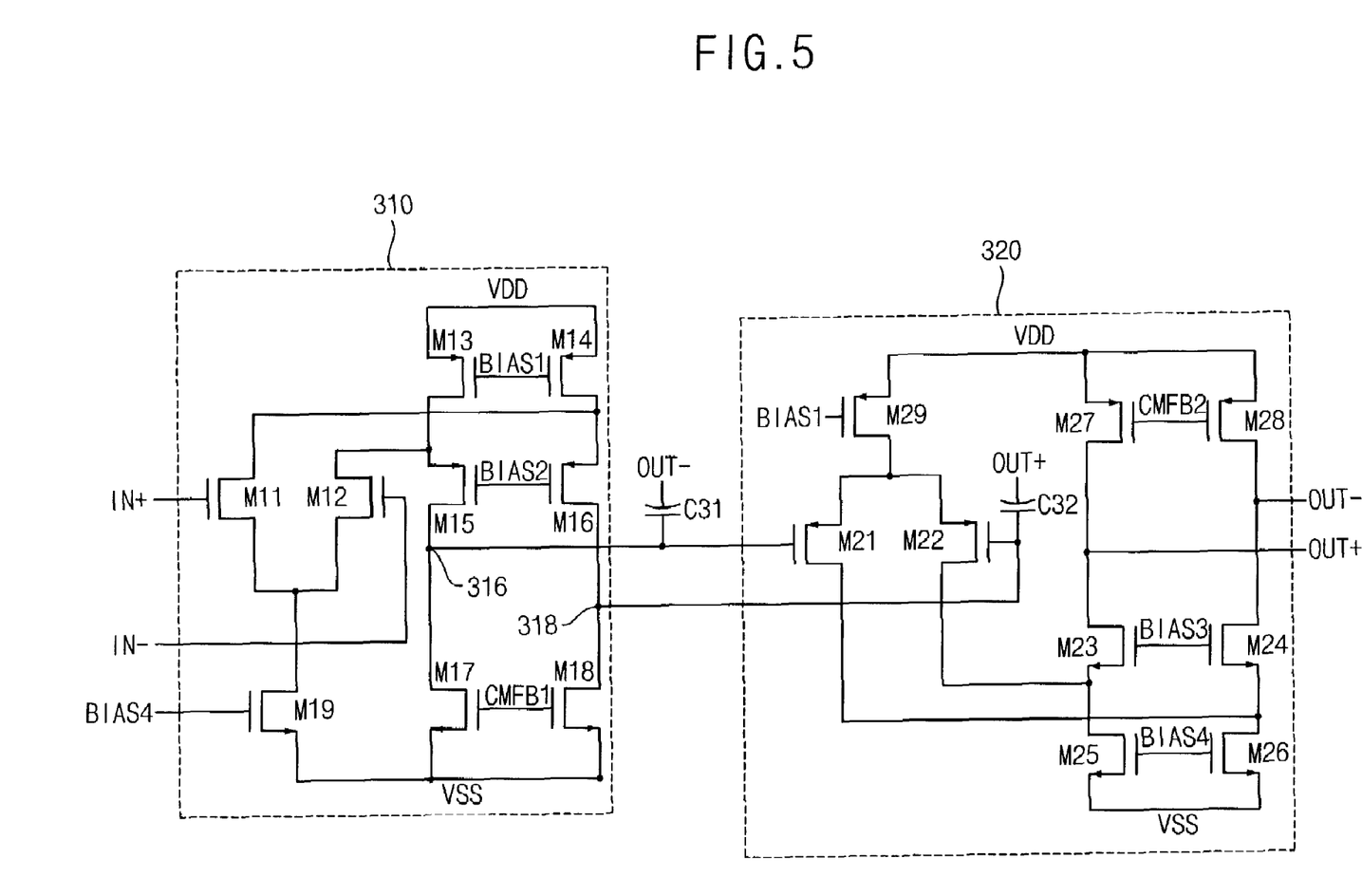
FIG. 5 is a circuit diagram illustrating a low-voltage operational amplifier where the compensation stage in FIG. 3 is replaced with compensation capacitors.

FIG. 5 is a circuit diagram illustrating a low-voltage operational amplifier where the compensation stage 330 in FIG. 3 is replaced with compensation capacitors C31 and C32.

Referring to FIG. 5, the first compensation capacitor C31 is connected to a node 316 and a gate of a first transistor M21, and receives a second output signal OUT− as feedback. The second compensation capacitor 032 is connected to a node 318 and a gate of a second transistor M22, and receives a first output signal OUT+ as feedback.

Figure 6:
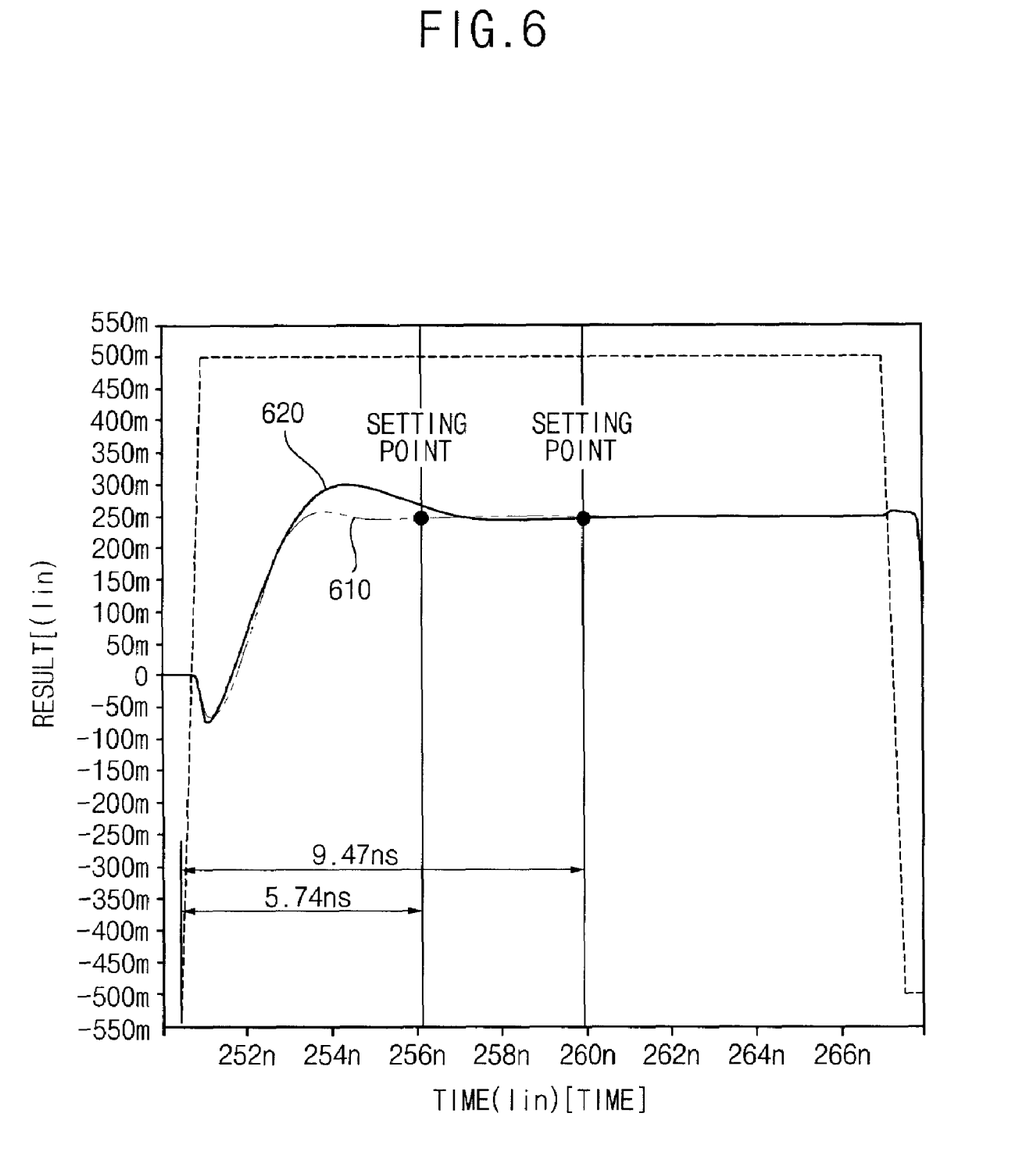
FIG. 6 is a waveform diagram illustrating simulation results of the low-voltage operational amplifiers of FIGS. 3 and 5.

FIG. 6 is a waveform diagram illustrating simulation results of the low-voltage operational amplifiers of FIGS. 3 and 5.

Referring to FIG. 6, an output 610 of the operational amplifier shown in FIG. 3 that includes a compensation stage 330 has a fast settling time compared with an output 620 of the operational amplifier shown in FIG. 5 that includes only compensation capacitors C31, C32 instead of the compensation stage 330. That is, the operational amplifier of FIG. 3 is faster than the operational amplifier of FIG. 5. In order to get f-3 dB gain, the operational amplifier of FIG. 3 consumes less current than the operational amplifier of FIG. 5.

An operational amplifying method according to an exemplary embodiment of the present invention includes amplifying a difference between a first signal and a second signal that constitute a differential pair, outputting an amplified first signal and an amplified second signal, amplifying a difference between the amplified first signal and the amplified second signal, outputting a first output signal and a second output signal that constitute a differential pair, receiving the amplified first signal, the amplified second signal, the first output signal, and the second output signal, and reducing a settling time of the first output signal and the second output signal. Because a description of the operational amplifying method is similar to the description of the low-voltage operational amplifier, a further description of the operational amplifying method is omitted.

In accordance with exemplary embodiments of the present invention, the low-voltage operational amplifier has a relatively high gain, a relatively large swing margin, and a relatively fast settling time when operating at a relatively low power-supply voltage.

In accordance with exemplary embodiments of the present invention, the operational amplifying method reduces a settling time of output signals.

While exemplary embodiments of the present invention and their advantages have been described in detail, it should be understood that various changes, substitutions and alterations may be made herein without departing from the scope of the invention.

What is claimed is:

1. A low voltage operational amplifier, comprising:
   a differential amplifying stage configured to amplify a difference between a first signal and a second signal that constitute a differential pair using an input pair of NMOS transistors, and configured to output an amplified first signal and an amplified second signal;
   an output amplifying stage configured to amplify a difference between the amplified first signal and the amplified second signal using an input pair of PMOS transistors, and configured to output a first output signal and a second output signal that constitute a differential pair; and a compensation stage configured to receive the amplified first signal, the amplified second signal, the first output signal, and the second output signal, and configured to reduce a settling time of the first output signal and the second output signal, wherein the compensation stage includes:
- a first transistor having a gate that receives a first bias signal, and a source that is connected to a power supply voltage,
- a second transistor having a gate that receives the first bias signal, and a source that is connected to the power supply voltage,
- a third transistor having a gate that receives a second bias signal, and a source that is connected to a drain of the first transistor,
- a fourth transistor having a gate that receives the second bias signal, and a source that is connected to a drain of the second transistor,
- a fifth transistor having a gate that receives a common mode feedback signal, a drain that is connected to a drain of the third transistor, and a source that is connected to a ground voltage,
- a sixth transistor having a gate that receives the common mode feedback signal, a drain that is connected to a drain of the fourth transistor, and a source that is connected to the ground voltage,
- a first compensation capacitor having a terminal that is connected to the drain of the first transistor, and another terminal that receives the second output signal, and
- a second compensation capacitor having a terminal that is connected to the drain of the second transistor, and another terminal that receives the first output signal, and wherein:
the amplified first signal is applied to the drain of the fourth transistor and the drain of the sixth transistor, and
the amplified second signal is applied to the drain of the third transistor and the drain of the fifth transistor.

2. The low voltage operational amplifier of claim 1, wherein a power supply voltage that is supplied to the differential amplifying stage, the output amplifying stage, and the compensation stage is between 0.9V and 1.0V.

3. The low voltage operational amplifier of claim 1, wherein the differential amplifying stage has a folded cascode structure.

4. The low voltage operational amplifier of claim 3, wherein the differential amplifying stage includes:
- a first transistor having a gate that receives the first signal;
- a second transistor having a gate that receives the second signal, and a source that is connected to a source of the first transistor;
- a current source connected to the source of the first transistor;
- a third transistor having a gate that receives a first bias signal, a drain that is connected to a drain of the second transistor, and a source that is connected to a power supply voltage;
- a fourth transistor having a gate that receives the first bias signal, a drain that is connected to a drain of the first transistor, and a source that is connected to the power supply voltage;
- a fifth transistor having a gate that receives a second bias signal, and a source that is connected to a drain of the third transistor;
- a sixth transistor having a gate that receives the second bias signal, and a source that is connected to a drain of the fourth transistor;
- a seventh transistor having a gate that receives a first common mode feedback signal, a drain that is connected to a drain of the fifth transistor, and a source that is connected to a ground voltage; and
- an eighth transistor having a gate that receives the first common mode feedback signal, a drain that is connected to a drain of the sixth transistor, and a source that is connected to the ground voltage, wherein the amplified second signal is outputted from the drain of the fifth transistor and the drain of the seventh transistor, and the amplified first signal is outputted from the drain of the sixth transistor and the drain of the eighth transistor.

5. The low voltage operational amplifier of claim 4, wherein each of the seventh transistor and the eighth transistor is a long channel NMOS transistor.

6. The low voltage operational amplifier of claim 5, wherein the current source is a NMOS transistor having a gate that receives a fourth bias signal, and a source that is connected to the ground voltage.

7. The low voltage operational amplifier of claim 1, wherein the output amplifying stage has a folded cascode structure.

8. The low voltage operational amplifier of claim 7, wherein the output amplifying stage includes:
- a first transistor having a gate that receives the amplified second signal;
- a second transistor having a gate that receives the amplified first signal, and a drain that is connected to a drain of the first transistor;
- a current source connected to the drain of the first transistor;
- a third transistor having a gate that receives a third bias signal, and a source that is connected to a drain of the second transistor;
- a fourth transistor having a gate that receives the third bias signal, and a source that is connected to a drain of the first transistor;
- a fifth transistor having a gate that receives a fourth bias signal, a drain that is connected to a source of the third transistor, and a source that is connected to a ground voltage;
- a sixth transistor having a gate that receives the fourth bias signal, a drain that is connected to a source of the fourth transistor, and a source that is connected to the ground voltage;
- a seventh transistor having a gate that receives a common mode feedback signal, a drain that is connected to a drain of the third transistor, and a source that is connected to a power supply voltage; and
- an eighth transistor having a gate that receives the common mode feedback signal, a drain that is connected to a drain of the fourth transistor, and a source that is connected to the power supply voltage, wherein the first output signal is outputted from the drain of the third transistor and the drain of the seventh transistor, and the second output signal is outputted from the drain of the fourth transistor and the drain of the eight transistor.

9. The low voltage operational amplifier of claim 8, wherein the current source is a long channel PMOS transistor having a gate that receives a first bias signal, and a source that is connected to the power supply voltage.

10. A low voltage operational amplifier, comprising:
a differential amplifying stage configured to amplify a difference between a first signal and a second signal that constitute a differential pair using an input pair of PMOS transistors, and configured to output an amplified first signal and an amplified second signal;
an output amplifying stage configured to amplify a difference between the amplified first signal and the amplified second signal using an input pair of NMOS transistors, and configured to output a first output signal and a second output signal that constitute a differential pair; and
a compensation stage configured to receive the amplified first signal, the amplified second signal, the first output signal, and the second output signal, and configured to reduce a settling time of the first output signal and the second output signal,
wherein the compensation stage includes:
a first transistor having a gate that receives a third bias signal,
a second transistor having a gate that receives the third bias signal,
a third transistor having a gate that receives a fourth bias signal, a drain that is connected to a source of the first transistor, and a source that is connected to a pound voltage,
a fourth transistor having a gate that receives the fourth bias signal, a drain that is connected to a source of the second transistor, and a source that is connected to the pound voltage,
a fifth transistor having a gate that receives a common mode feedback signal, a drain that is connected to a drain of the first transistor, and a source that is connected to a power supply voltage,
a sixth transistor having a gate that receives the common mode feedback signal, a drain that is connected to a drain of the second transistor, and a source that is connected to the power supply voltage,
a first compensation capacitor having a terminal that is connected to the source of the first transistor, and another terminal that receives the second output signal, and
a second compensation capacitor having a terminal that is connected to the source of the second transistor, and another terminal that receives the first output signal, and
wherein:
the amplified first signal is applied to the drain of the second transistor and the drain of the sixth transistor, and
the amplified second signal is applied to the drain of the first transistor and the drain of the fifth transistor.

11. The low voltage operational amplifier of claim 10, wherein a power supply voltage that is supplied to the differential amplifying stage, the output amplifying stage, and the compensation stage is between 0.9V and 1.0V.

12. The low voltage operational amplifier of claim 10, wherein the differential amplifying stage has a folded cascode structure.

13. The low voltage operational amplifier of claim 12, wherein the differential amplifying stage includes:
a first transistor having a gate that receives the first signal;
a second transistor having a gate that receives the second signal, and a source that is connected to a source of the first transistor;
a current source connected to the source of the first transistor;
a third transistor having a gate that receives a third bias signal, and a source that is connected to a drain of the second transistor;
a fourth transistor having a gate that receives the third bias signal, and a source that is connected to a drain of the first transistor;
a fifth transistor having a gate that receives a fourth bias signal, a drain that is connected to a source of the third transistor, and a source that is connected to a ground voltage;
a sixth transistor having a gate that receives the fourth bias signal, a drain that is connected to a source of the fourth transistor, and a source that is connected to the ground voltage;
a seventh transistor having a gate that receives a common mode feedback signal, a drain that is connected to a drain of the third transistor, and a source that is connected to a power supply voltage; and
an eighth transistor having a gate that receives the common mode feedback signal, a drain that is connected to a drain of the fourth transistor, and a source that is connected to the power supply voltage,
wherein the amplified second signal is outputted from the source of the third transistor and the source of the seventh transistor, and the amplified first signal is outputted from the drain of the fourth transistor and the drain of the eighth transistor.

14. The low voltage operational amplifier of claim 13, wherein the current source is a tong channel PMOS transistor having a gate that receives a first bias signal, a source that is connected to the power supply voltage.

15. The low voltage operational amplifier of claim 12, wherein the output amplifying stage has a folded cascode structure.

16. The low voltage operational amplifier of claim 15, wherein the output amplifying stage includes:
a first transistor having a gate that receives the amplified second signal;
a second transistor having a gate that receives the amplified first signal, and a source that is connected to a source of the first transistor;
a current source connected to the source of the first transistor;
a third transistor having a gate that receives a first bias signal, a drain that is connected to a drain of the second transistor, and a source that is connected to a power supply voltage;
a fourth transistor having a gate that receives the first bias signal, a drain that is connected to a drain of the first transistor, and a source that is connected to the power supply voltage;
a fifth transistor having a gate that receives a second bias signal, and a source that is connected to a drain of the third transistor;
a sixth transistor having a gate that receives the second bias signal, and a source that is connected to a drain of the fourth transistor;
a seventh transistor having a gate that receives a common mode feedback signal, a drain that is connected to a drain of the fifth transistor, and a source that is connected to a ground voltage; and an eighth transistor having a gate that receives the common mode feedback signal, a drain that is connected to a drain of the sixth transistor, and a source that is connected to the ground voltage, and wherein the first output signal is outputted from the drain of the fifth transistor and the drain of the seventh transistor, and the second output signal is outputted from the drain of the sixth transistor and the drain of the eighth transistor.

17. The tow voltage operational amplifier of claim 16, wherein each of the seventh transistor and the eighth transistor is a long channel NMOS transistor.

18. The low voltage operational amplifier of claim 17, wherein the current source is a PMOS transistor having a gate that receives a fourth bias signal, and a source that is connected to the ground voltage.

* * * * *